United States Patent [19]
Birkmayer

[11] Patent Number: 5,381,147
[45] Date of Patent: Jan. 10, 1995

[54] PROCESS FOR THE ANALOG-TO-DIGITAL CONVERSION OF MICROWAVE SIGNALS

[75] Inventor: Wolfram Birkmayer, Maxhütte-Haidhof, Germany

[73] Assignee: Deutsche Aerospace AG, Germany

[21] Appl. No.: 61,803

[22] Filed: May 17, 1993

[30] Foreign Application Priority Data

May 15, 1992 [DE] Germany .................... 4216065

[51] Int. Cl.6 ............................................ H03M 1/00
[52] U.S. Cl. .................................. 341/137; 341/155
[58] Field of Search ............... 341/137, 155, 133; 385/1

[56] References Cited

U.S. PATENT DOCUMENTS

| | | | |
|---|---|---|---|
| 4,325,603 | 4/1982 | Marom | 350/96.14 |
| 4,502,037 | 2/1985 | Le Parquier et al. | 341/137 |
| 4,571,576 | 2/1986 | Olsson et al. | 341/137 |
| 4,947,170 | 8/1990 | Falk | 341/137 |

Primary Examiner—Marc S. Hoff
Attorney, Agent, or Firm—Evenson, McKeown, Edwards & Lenahan

[57] ABSTRACT

An optical analog to digital converter for microwave signals in which the input to a Mach-Zehnder modulator/interferometer is split into two branches which are provided with respective laser carrier signals having a difference frequency equal to a desired conversion frequency. An input microwave signal is then used to modulate the carrier signal present in one of the input branches to the interferometer, and the resulting output signal is detected and compared with a predetermined threshold value to generate a binary 1 or 0 output. In a preferred embodiment, a plurality of such interferometers are arranged in a parallel configuration and the modulation of the respective carrier signals is scaled by a factor of two.

20 Claims, 3 Drawing Sheets

PROCESS FOR THE ANALOG-TO-DIGITAL CONVERSION OF MICROWAVE SIGNALS

BACKGROUND AND SUMMARY OF THE INVENTION

This invention relates to a process and apparatus for analog-to-digital conversion of microwave signals using optical interferometer techniques.

Known Mach-Zehnder modulator/interferometers which can be used for the analog-to-digital conversion are suitable only for electric signals with a frequency of up to approximately 1.0 GHz. (Mach-Zehnder modulator/interferometers of this type are well known to those skilled in the art, and are described, for example, by G. D. H. King and R. Cebulski in "Analogue-to-Digital Conversion Using Integrated Electro-Optic Interferometers," Electronic Letters, Vol. 18, No. 25, Dec. 9, 1982, pp 1099–1100.) Thus, the known optical analog-to-digital converters permit a digitization only in the base band.

It is an object of the present invention to provide a process for digitizing high-frequency signals with an inherent frequency down conversion such that no frequency converter external to the analog-to-digital converter is required. The process according to the invention is useful for phased SAR and radar antennas.

This object is achieved by the analog to digital converter according to the invention, in which the input to a Mach-Zehnder modulator/interferometer of the type noted above is split into two branches, which are provided with respective laser carrier signals having a difference frequency which corresponds to the desired conversion frequency (the center frequency of the microwave signal to be digitized). The input microwave signal is then used to modulate the optical carrier signal present in one of the input branches to the interferometer, and the resulting output signal from the interferometer is detected and compared with a predetermined threshold value to generate a binary 1 or 0 output. In a preferred embodiment, a plurality of such interferometers is arranged in a parallel configuration, and the modulation of the respective carrier signals is scaled by a factor of two.

Other objects, advantages and novel features of the present invention will become apparent from the following detailed description of the invention when considered in conjunction with the accompanying drawings.

DETAILED DESCRIPTION OF THE DRAWINGS

Figure 1:
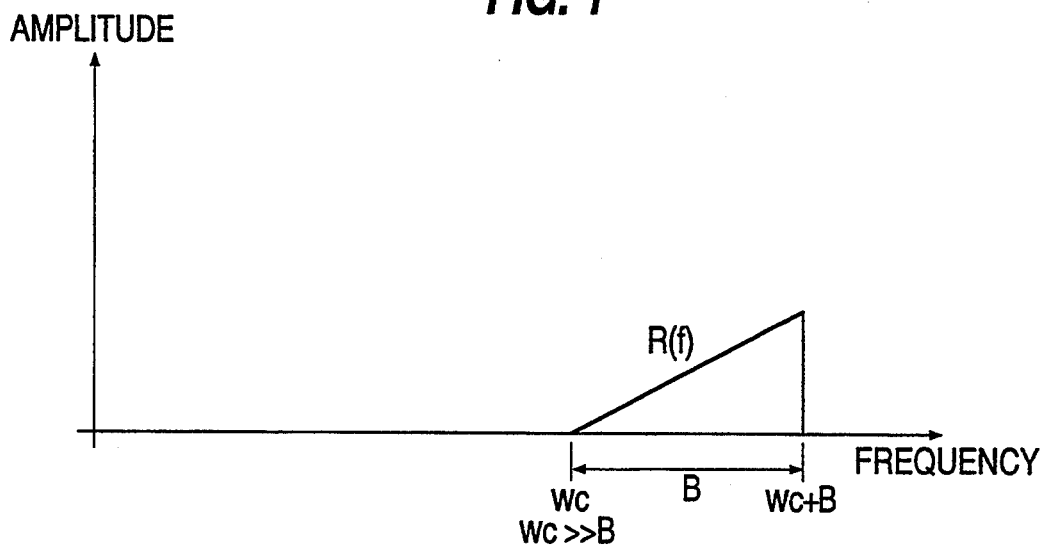
FIG. 1 is a diagram of the spectrum of a signal that is to be digitized and has a bandwidth B which is less than a lower cut-off frequency $\omega_c$, with $\omega_c >> B$.
Figure 2:
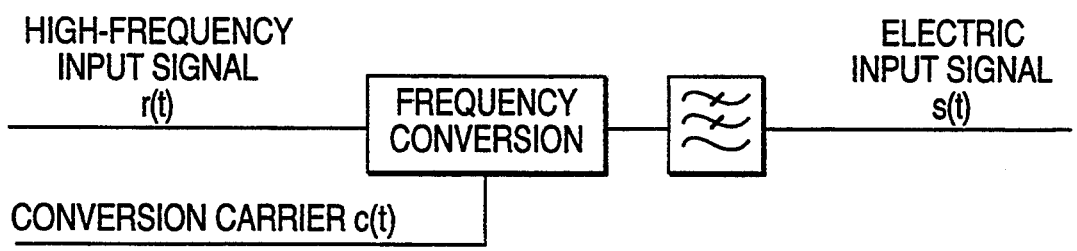
FIG. 2 is a schematic diagram which illustrates the frequency conversion apparatus for the digitization of high-frequency signals.

In signal processing for phased antennas, it is necessary to digitize higher-frequency signals ($>> 10.0$ GHz) having a bandwidth of approximately 1 GHz. FIG. 1 illustrates a spectrum of such a signal, with a lower cut-off frequency $\omega_c$ and an upper cut-off frequency $\omega_c + B$. Such signals can be digitized by means of conventional analog-to-digital converters, to a bandwidth of B, after they have first been converted from a higher frequency band to a lower one as illustrated in FIG. 2, so that the upper cut-off frequency of the converted signal is within the bandwidth of the analog-to-digital converter.

Figure 3:
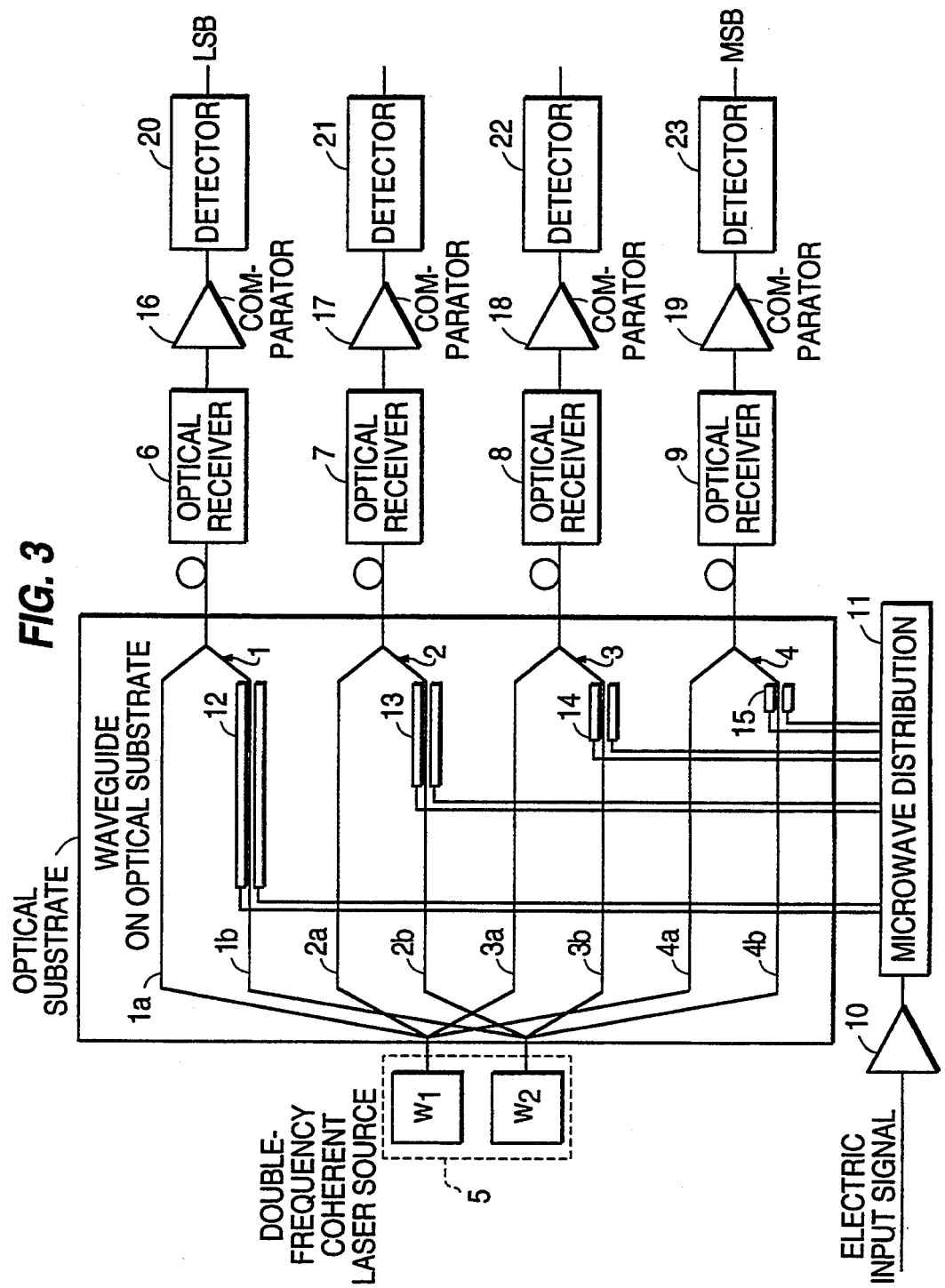
FIG. 3 is a schematic diagram of an optical analog-to-digital converter with Mach-Zehnder interferometers according to the invention.

FIG. 3 is a schematic diagram of an analog to digital converter according to the invention which utilizes four Mach-Zehnder modulator/interferometers 1–4 comprising optical waveguides arranged on an optical substrate in a manner known to those skilled in the art. The input to each interferometer is divided into two branches, 1a, b; 2 a, b; 3a, b; and 4a, b, respectively. A two frequency laser source 5 provides first and second laser signals having frequencies $\omega_1$ and $\omega_2$ the difference frequency of which corresponds to the conversion frequency (that is, the center frequency of the microwave signal that is to be digitized). The laser signal $\omega_1$, is provided as an input to a first branch, 1a–4a respectively, of each of the Mach-Zehnder interferometers 1–4, while the laser signal $\omega_2$ is input to the second branch, 1b–4b, respectively, of each of the interferometers. Due to interference of the two carriers $\omega_1$ and $\omega_2$ in the interferometers, the signal present at each of the optical receivers 6–9 will have a frequency that is equal to the difference between the respective carriers $\omega_1$ and $\omega_2$, and will correspond to the center frequency of the microwave input signal.

The microwave input signal is received by input amplifier 10, and provided to the microwave splitter 11. Outputs from the splitter 11 are provided to electrodes 12–15 which may be deposited on the optical substrate, for example, by known deposition techniques. The electrodes 12–15 modulate the carrier laser signal $\omega_2$ in each of the respective branches 1b–4b of the Mach-Zehnder modulator/interferometers 1–4. In order to achieve a binary output signal, the electrical fields generated by each of the electrodes 12–15 differ by precisely a factor of 2, as is represented in FIG. 3 by the size of the electrodes. As a result of this arrangement, the signals detected by the respective optical receivers 6–9 each contain the input microwave signal, modulated on a carrier which has a frequency $\omega_1-\omega_2$. Each signal is a one bit digitized version of the microwave signal. The order of significant bits depends on the length of the electrode with respect to the length of the electrode of the least significant bit.

Each of the detected signals is then entered into a comparator 16–19, where it is compared with a threshold value corresponding to approximately half of the maximum optical intensity. Detectors 20–23 measure the level of interference between the optical signals in each interferometer.

When the optical amplitude of the detected signal is greater than the threshold value, the logic value is "1", and when the optical intensity is less than the threshold, the logic value is "0". Each of the logic signals between "Least Significant Bit" LSB and "Most Significant Bit" MSB is detected by means of detectors and is stored until the digitization of the next value takes place. This sampling process is controlled by an external sampling clock and a memory (not shown), which samples and holds the digitized signals in a conventional manner.

The number of modulators used in the analog to digital converter according to the invention depends on the desired digital resolution. In the embodiment that is described and illustrated in FIG. 3, 4-bit versions are shown for which four modulators are required.

Figure 4:
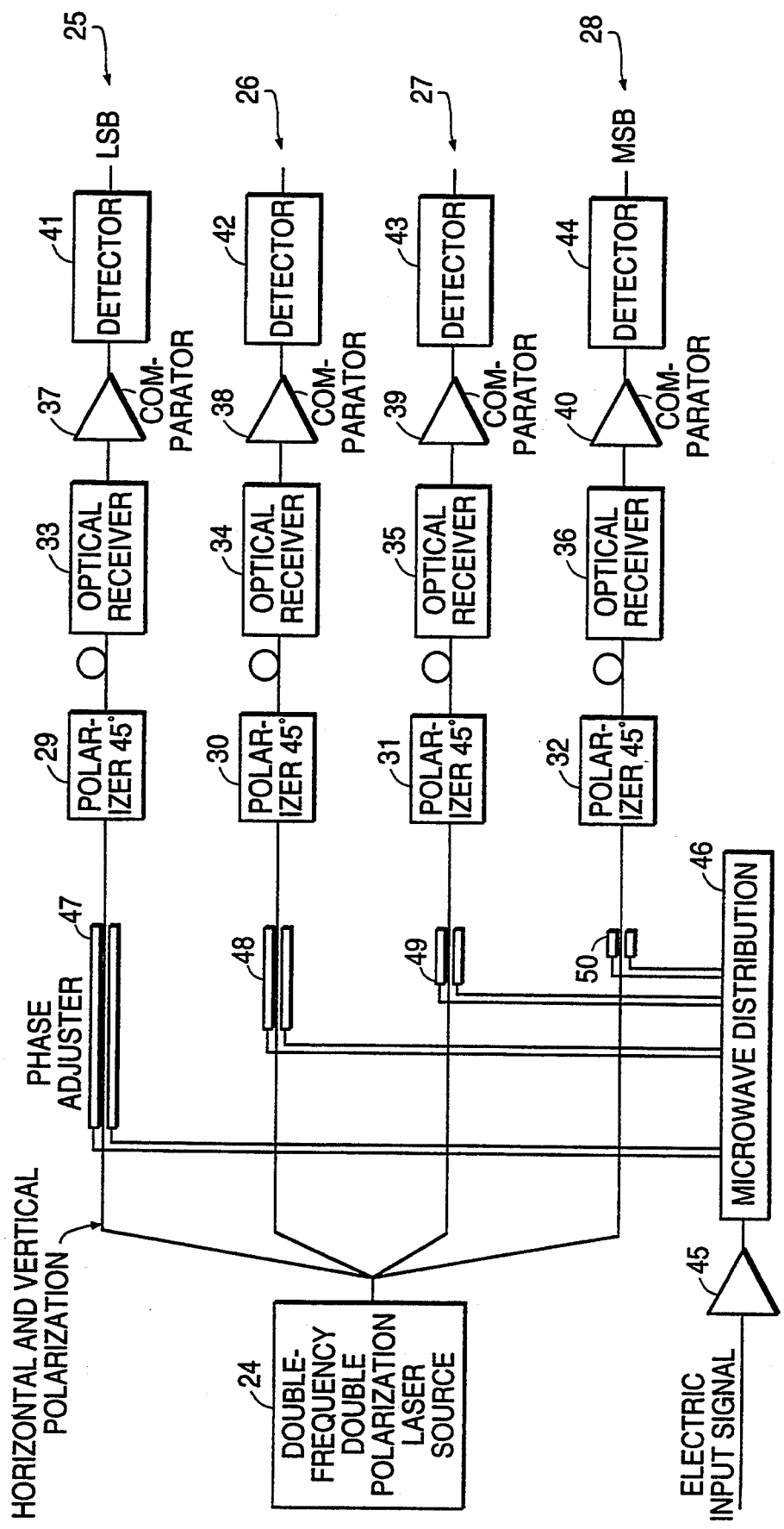
FIG. 4 is a schematic diagram of an optical analog-to-digital converter with optical phase shifter according to the invention.

FIG. 4 shows another embodiment of the optical analog-to-digital converter according to the invention, in which first and second laser carrier signals provided by the two frequency laser source 24 are both coupled to each of the respective inputs of Mach-Zehnder modulators with phase shifters 47–50. A first of the optical carrier signals is polarized in a vertical plane and has a frequency $\omega_1$, and the second optical carrier signal is polarized in a horizontal plane and has a frequency $\omega_2$, with the difference frequency of $\omega_1$ and $\omega_2$ again corresponding to the conversion frequency of the input microwave signal to be digitized. Each of the Mach-Zehnder modulators with phase shifters 67–50 has a 45° polarizer 29–32 which receives both of the orthogonally polarized first and second optical carrier signals and outputs a signal having a frequency equal to the difference of $\omega_1$ and $\omega_2$. This output signal is provided to optical receivers 33–36, comparators 37–40 and detectors 41–44, which function in the same manner as in FIG. 3.

The input microwave signal in FIG. 4 is received by input amplifier 45 and distributed by splitter 46 to each of four phase shifters 47–50, where it is used to phase modulate the carrier signals present in the respective Mach-Zehnder modulator/interferometers relative to each other. The output signal is the optically interfered signal converted to an electrical signal. In this manner, a single Mach-Zehnder modulator may be used for digitizing the analog input signal about the intermediate frequency $\omega_c$ by means of one bit.

Although the invention has been described and illustrated in detail, it is to be clearly understood that the same is by way of illustration and example, and is not to be taken by way of limitation. The spirit and scope of the present invention are to be limited only by the terms of the appended claims.

I claim:

1. Process for analog to digital conversion of a microwave signal by means of an arrangement of at least one optical modulator/interferometer having an optical wave guide, said process comprising the steps of:

providing said optical wave guide of said at least one modulator with at least two inputs, each input being adapted to couple an optical signal into said optical wave guide;

coupling a first laser carrier signal having a first optical frequency into a first one of said at least two inputs;

coupling a second laser carrier signal having a second optical frequency into a second one of said at least two inputs, said first and second carrier signals having a difference frequency which corresponds to a center frequency of said microwave signal;

modulating optical phase of said first laser carrier signal with said microwave signal;

detecting an interference signal of said first and second carrier signals and generating an electric signal having an intensity indicative of a level of interference between said first and second signals; and comparing intensity of said electric signal with a predetermined threshold value.

2. Process according to claim 1, wherein said predetermined threshold value corresponds approximately to one half the maximum amplitude of the microwave signal.

3. Process according to claim 2, wherein said modulating step comprises generating an electric field in said optical wave guide of said at least one optical modulator/interferometer, said electric field being responsive to amplitude of said microwave signal.

4. Process according to claim 3 wherein the electric field generated in said optical wave guides of each of said at least one optical modulator/interferometer differ substantially by a factor of two.

5. Process according to claim 4, wherein said at least one optical modulator/interferometer is a Mach-Zehnder modulator/interferometer.

6. Process according to claim 1, wherein said arrangement comprises a plurality of optical modulator/interferometers.

7. Process according to claim 6, wherein said modulating step comprises generating an electric field in said optical wave guide of said at least one optical modulator/interferometer, said electric field being responsive to amplitude of said microwave signal.

8. Process according to claim 1, wherein said at least one optical modulator/interferometer is a Mach-Zehnder modulator/interferometer.

9. Process according to claim 1, wherein said modulating step comprises generating an electric field in said optical wave guide of said at least one optical modulator/interferometer, said electric field being responsive to amplitude of said microwave signal.

10. Apparatus for analog to digital conversion of a microwave signal, comprising:

at least one optical modulator/interferometer comprising an optical wave guide having at least two inputs, each such input being adapted to couple an optical signal into said optical wave guide;

a source of first and second laser carrier signals having first and second optical frequencies respectively and a difference frequency which corresponds to a center frequency of said microwave signal, said first laser carrier signal being coupled into a first one of said at least two inputs and said second laser carrier signal being coupled into a second one of said at least two inputs;

a modulator coupled to modulate the phase of one of said first and second laser carrier signals in response to said microwave signal;

a detector coupled to receive an interference signal of said first and second laser carrier signals from said at least one optical wave guide, and to generate an electric signal indicative of a magnitude of said interference signal; and a comparator coupled to receive said electric signal and compare intensity thereof with a predetermined threshold value.

11. Apparatus according to claim 10, wherein said predetermined threshold value corresponds approximately to one half the maximum amplitude of the microwave signal.

12. Apparatus according to claim 10, comprising a plurality of optical modulator/interferometers.

13. Apparatus according to claim 12, wherein said modulator comprises means for generating an electric field in said optical wave guide of said at least one optical modulator/interferometer in response to amplitude of said microwave signal.

14. Apparatus according to claim 13, wherein the electric field generated in said optical wave guide of each of said at least one optical modulator/interferometer differ substantially by a factor of two.

15. Apparatus according to claim 10, wherein said modulator comprises means for generating an electric field in said optical wave guide of said at least one optical modulator/interferometer in response to amplitude of said microwave signal.

16. Process for analog to digital conversion of a microwave signal by means of an arrangement of at least one optical modulator/interferometer having an optical wave guide, said process comprising the steps of:

providing a source of first and second laser carrier signals, having first and second optical frequencies respectively and a difference frequency which corresponds to a center frequency of said microwave signal;

modulating one of said first and second laser carrier signals with said microwave signal;

coupling said modulated laser carrier signal and the other of said first and second laser carrier signals into said optical wave guide of said at least one optical modulator/interferometer whereby a difference frequency is generated in said optical wave guide;

detecting said difference frequency and generating an electric signal having an intensity indicative thereof;

comparing the intensity of said electric signal with a predetermined threshold value.

17. Process according to claim 16, wherein said first laser carrier signal is polarized in a first plane and said second laser carrier signal is polarized in a second plane substantially perpendicular to said first plane; and wherein said detecting step is performed by means of a polarizer coupled to receive an output from said optical wave guide and to detect signals polarized in a plane which is oriented substantially at a 45° angle to said first and second planes.

18. Process according to claim 17, wherein said modulating step is performed by means of a phase shifter, which modulates a phase of said one of said first and second laser carrier signals relative to the other of said first and second laser carrier signals.

19. Process according to claim 18, wherein said arrangement comprises a plurality of optical modulator/interferometers, and magnitude of phase modulation performed by said phase shifter for each of said optical modulator/interferometers differs by substantially a factor two.

20. Apparatus for analog to digital conversion of a microwave signal, comprising:

at least one optical modulator/interferometer comprising an optical wave guide;

a source of first and second laser carrier signals having first and second optical frequencies respectively and a difference frequency which corresponds to a center frequency of said microwave signal, said first laser carrier signal being polarized in a first plane and said second laser carrier signal being polarized in a second plane substantially perpendicular to said first plane;

means for coupling said first and second laser carrier signals into said optical wave guide;

a polarizer coupled to receive an output from said optical wave guide and to detect signals that are polarized in a plane oriented substantially at a 45% angle relative to said first and second planes;

a detector coupled to receive signals detected by said polarizer and to generate an electric signal having an intensity indicative of a magnitude thereof:

a comparator coupled to receive said electric signal and compare intensity thereof with a predetermined threshold value; and a phase shifter coupled to receive said microwave signal and to modulate phase of one of said first and second laser carrier signals in response to said microwave signal.

* * * * *